(12) United States Patent
Kim et al.

(10) Patent No.: US 8,304,981 B2
(45) Date of Patent: Nov. 6, 2012

(54) ORGANIC LIGHT EMITTING DIODE DISPLAY AND MANUFACTURING METHOD THEREOF

(75) Inventors: Mu-Gyeom Kim, Hwaseong-si (KR); Byoung-Seong Jeong, Yongin-si (KR); Seong-Kweon Heo, Suwon-si (KR); Min-Chul Shin, Seoul (KR); Jong-Moo Huh, Hwaseong-si (KR); Chang-Mo Park, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 104 days.

(21) Appl. No.: 12/433,093

(22) Filed: Apr. 30, 2009

(65) Prior Publication Data
US 2010/0133991 A1 Jun. 3, 2010

(30) Foreign Application Priority Data
Dec. 1, 2008 (KR) .................. 10-2008-0120713

(51) Int. Cl.
*H01L 51/00* (2006.01)
(52) U.S. Cl. .......................... 313/504; 257/59
(58) Field of Classification Search .................. 313/504, 313/506; 257/72, 40, 59
See application file for complete search history.

(56) References Cited

U.S. PATENT DOCUMENTS

| | | | |
|---|---|---|---|
| 6,943,372 B2 | 9/2005 | Lin | |
| 7,208,756 B2 | 4/2007 | Shih et al. | |
| 2002/0056838 A1* | 5/2002 | Ogawa | 257/59 |
| 2005/0017244 A1* | 1/2005 | Hoffman et al. | 257/72 |
| 2005/0250260 A1* | 11/2005 | Hayase et al. | 438/149 |
| 2007/0099333 A1* | 5/2007 | Moriya | 438/96 |
| 2007/0188089 A1* | 8/2007 | Choi et al. | 313/506 |
| 2008/0035920 A1* | 2/2008 | Takechi et al. | 257/43 |

FOREIGN PATENT DOCUMENTS

| | | |
|---|---|---|
| JP | 08-330600 | 12/1996 |
| JP | 2006-203073 | 8/2006 |
| KR | 100567272 | 3/2006 |
| KR | 100684835 | 2/2007 |
| KR | 100696522 | 3/2007 |
| KR | 100708722 | 4/2007 |
| KR | 100712210 | 4/2007 |
| KR | 1020070102969 | 10/2007 |
| KR | 100787439 | 12/2007 |

(Continued)

OTHER PUBLICATIONS

English Abstract for Publication No. 08-330600.

(Continued)

*Primary Examiner* — Karabi Guharay
(74) *Attorney, Agent, or Firm* — F. Chau & Associates, LLC

(57) ABSTRACT

An organic light emitting diode display includes a substrate. A control electrode is on the substrate. A gate insulating film covers the control electrode. An input electrode and an output electrode are on the gate insulating film and face each other. An oxide semiconductor is between the input electrode and the output electrode and on the control electrode. A pixel electrode is on portions of the edges of the output electrode and is electrically connected. An organic light emitting member is on the pixel electrode. A common electrode is on the organic light emitting member. The oxide semiconductor and the pixel electrode may be of the same layer.

10 Claims, 12 Drawing Sheets

FOREIGN PATENT DOCUMENTS

| | | |
|---|---|---|
| KR | 100810645 | 2/2008 |
| KR | 1020080011829 | 2/2008 |
| KR | 1020080077829 | 2/2008 |
| KR | 1020080052107 | 6/2008 |
| KR | 100845557 | 7/2008 |

OTHER PUBLICATIONS

English Abstract for Publication No. 100567272.
English Abstract for Publication No. 2006-203073.
English Abstract for Publication No. 100684835.
English Abstract for Publication No. 100696522.
English Abstract for Publication No. 100708722.
English Abstract for Publication No. 100712210.
English Abstract for Publication No. 1020070102969.
English Abstract for Publication No. 100787439.
English Abstract for Publication No. 1020080011829.
English Abstract for Publication No. 100810645.
English Abstract for Publication No. 1020080052107.
English Abstract for Publication No. 10084557.

\* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2008-0120713 filed in the Korean Intellectual Property Office on Dec. 1, 2008, the entire contents of which are incorporated herein by reference.

BACKGROUND OF THE INVENTION (a) Field of the Invention

The present disclosure relates to display devices, and, more particularly, to an organic light emitting diode (OLED) display and a manufacturing method thereof.

(b) Discussion of the Related Art

With the demand for lightweight and thin monitors or televisions liquid crystal displays ("LCDs") are being substituted for conventional cathode ray tubes ("CRTs").

However, since the LCD is a light receiving/emitting device, the LCD requires a backlight, and may have a slow response speed and limited viewing angle as compared with the conventional CRT.

In recent years, an OLED display has attracted attention as a display device due to its faster response speed and wider viewing angle.

The OLED display includes two electrodes and a light emitting layer positioned therebetween. Electrons injected from one electrode and holes injected from the other electrode are combined in the light emitting layer so as to form excitons, and the excitons emit light through energy emission.

Since the OLED display is a self-emitting type, it does not need an additional light source. Therefore, the OLED display has low power consumption, as well as excellent response speed, viewing angle, and contrast ratio.

An OLED display can be classified as a passive matrix OLED display and an active matrix OLED display according to its driving mode.

Among these, an active matrix OLED display has a structure in which electrodes and a light emitting layer are on a thin film transistor display panel, and the thin film transistor display panel includes signal lines, a switching thin film transistor connected to the signal lines that controls a data voltage, and a driving thin film transistor that flows a current into a organic light emitting device by supplying the data voltage received from the switching thin film transistor as a gate voltage.

A semiconductor constituting the channel layer of the thin film transistor of the OLED display may have its characteristics changed during a photolithography process for forming another thin film, and such a change of characteristics of the semiconductor may deteriorate the performance of the thin film transistor.

An oxide semiconductor can be used for the semiconductor constituting the channel layer of the thin film transistor of the OLED display. When an oxide semiconductor is used, the characteristics of the semiconductor layer may deteriorate due to light. Thus, it is important to block external light.

Further, when forming a thin film transistor, an organic light emitting element, and thin film layers such as an anode and a cathode of an OLED display, a photolithography process is used involving a mask. As the number of masks used in each photolithography process increases, the manufacturing process becomes complicated and the manufacturing cost increases. Therefore, in order to improve the productivity of OLED displays, it becomes desirable to form a thin film layer using a smaller number of masks.

SUMMARY OF THE INVENTION

In accordance with exemplary embodiments of the present invention an OLED display is provided which minimizes the influence on a semiconductor layer during the formation of another thin film layer, raises the productivity of the OLED display by simplifying the manufacturing process, and prevents deterioration of the performance of an oxide semiconductor caused by external light.

An OLED display according to an exemplary embodiment of the present invention includes: a substrate; a control electrode on the substrate; a gate insulating film that covers the control electrode; an input electrode and an output electrode on the gate insulating film and facing each other; an oxide semiconductor between the input electrode and the output electrode and on the control electrode; a pixel electrode on and electrically connected to portions of the edges of the output electrode; an organic light emitting member on the pixel electrode; and a common electrode on the organic light emitting member.

The oxide semiconductor and the pixel electrode may be a same layer, and may include hydrogen injected into the upper part thereof.

The OLED display may further include an insulation film covering the oxide semiconductor and having a first opening exposing the pixel electrode, and the organic light emitting member may be in the first opening.

The insulating film may include a black pigment.

The gate insulating film may have a second opening, and the OLED display may further include a blocking portion that covers the second opening may be further provided.

The lower edges of the oxide semiconductor may be surrounded by the control electrode, the input electrode and the output electrode, and the blocking portion.

A surface of the pixel electrode may be plasma treated.

The gate insulating layer may have a third opening, and the OLED display may further include a blocking portion that covers the third opening is further provided.

The blocking portion may include a black pigment.

The blocking portion may be made of a same material as the input electrode and the output electrode.

Edges of the oxide semiconductor proximal to the substrate may be surrounded by the control electrode, the input electrode, the output electrode, and the blocking member.

A width of the oxide semiconductor may be smaller than a width of the input electrode and a width of the output electrode.

The pixel electrode may be formed directly on the portions of edges of the output electrode.

A manufacturing method of an OLED display according to one exemplary embodiment of the present invention includes: forming a control electrode on a substrate; forming a gate insulating film on the control electrode; forming an input electrode and an output electrode that face each other on the gate insulating film; forming a semiconductor on the control electrode above the input electrode and the output electrode and forming a pixel electrode on portions of the edges of the output electrode; forming an organic light emitting member on the pixel electrode; and forming a common electrode on the organic light emitting member.

The forming of a semiconductor and a pixel electrode may include depositing an oxide semiconductor on the substrate and photo-etching the oxide semiconductor, and heat-treating the pixel electrode.

The heat treating may be performed under an atmosphere of oxygen ($O_2$) and nitrogen ($N_2$), or under an atmosphere of oxygen ($O_2$), nitrogen ($N_2$), and hydrogen ($H_2$).

At least 50 sccm of the atmosphere gas may be injected.

The heat treating may be performed at a temperature of about 100° C. or more.

The manufacturing method of an OLED display may further include forming an insulation film that covers the semiconductor and has a first opening that exposes the pixel electrode, and the organic light emitting member may be in the first opening.

The insulation film may be made of silicon oxide or silicon nitride containing a black pigment.

The forming of the gate insulating film may further comprise: forming a second opening in the gate insulating film; and the manufacturing method of an OLED display may further include forming a blocking portion that covers the second opening.

According to exemplary embodiments of the present invention, by forming a semiconductor layer on the input electrode and the output electrode, damage to the semiconductor layer can be reduced.

Furthermore, a semiconductor and a pixel electrode are simultaneously by the use of an oxide semiconductor, thus simplifying the manufacturing process and raising the productivity, and a layer containing a black pigment is above and below the semiconductor, thereby blocking light that can enter the semiconductor layer and preventing degradation of the characteristics of the semiconductor layer caused by light.

DETAILED DESCRIPTION OF THE EMBODIMENTS

Figure 1:
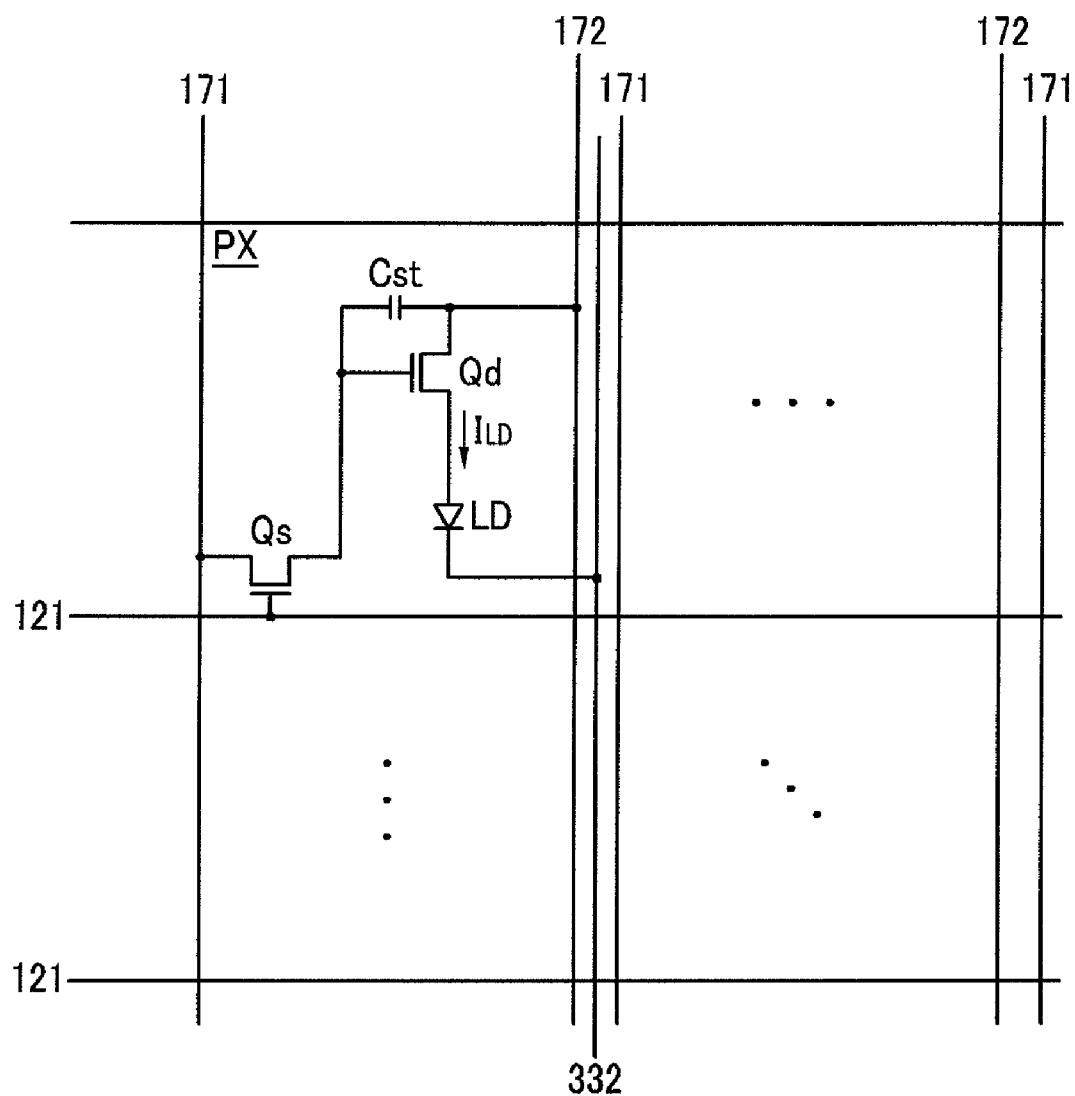
FIG. 1 is an equivalent circuit diagram of an OLED display according to an exemplary embodiment of the present invention.

Referring now to FIG. 1, an OLED display according to this exemplary embodiment includes a plurality of signal lines 121, 171, 172, and a plurality of pixels PX connected thereto and arranged substantially in a matrix.

The signal lines include a plurality of gate lines 121 that transmit gate signals (or scanning signals), a plurality of data lines 171 that transmit data signals, and a plurality of driving voltage lines 172 that transmit a driving voltage. The gate lines 121 extend in a row direction and are substantially parallel to each other. The data lines 171 and the driving voltage lines 172 extend in a column direction and are substantially parallel to each other.

Each pixel PX includes a switching transistor Qs, a driving transistor Qd, a storage capacitor Cst, and an organic light emitting element LD.

The switching transistor Qs includes a control terminal, an input terminal, and an output terminal. The control terminal is connected to the gate lines 121, the input terminal is connected to the data lines 171, and the output terminal is connected to the driving transistor Qd, respectively. The switching transistor Qs transmits data signals received from the data lines 171 to the driving transistor Qd in response to a scanning signal from the gate lines 121.

The driving transistor Qd also has a control terminal, an input terminal, and an output terminal. The control terminal is connected to the switching transistor Qs, the input terminal is connected to the driving voltage lines 172, and the output terminal is connected to the organic light emitting element LD. The driving transistor Qd generates an output current ILD having a magnitude depending on a voltage difference between the control terminal and the output terminal.

The capacitor Cst is connected between the control terminal and the input terminal of the driving transistor Qd. The capacitor Cst stores the data signals applied to the control terminal of the driving transistor Qd and maintains the signals after the switching transistor Qs turns off.

The organic light emitting element LD is, for example, an OLED, which has an anode connected to the output terminal of the driving transistor Qd and a cathode connected to a common voltage (not shown) via voltage line 332. The organic light emitting element LD displays images by emitting light with varied intensity according to the output current ILD of the driving transistor Qd.

As appreciated by those skilled in the art, the connections among the transistors Qs, Qd, the capacitor Cst, and the organic light emitting element LD may be modified. In some cases, there may be other transistors that compensate for the threshold voltage of the organic light emitting element LD and the driving transistor Qd as well as a switching transistor Qs and a driving transistor Qd.

Hereinafter, the detailed structure of the OLED display shown in FIG. 1 will be described with reference to FIGS. 2 and 3 along with FIG. 1.

Figure 2:
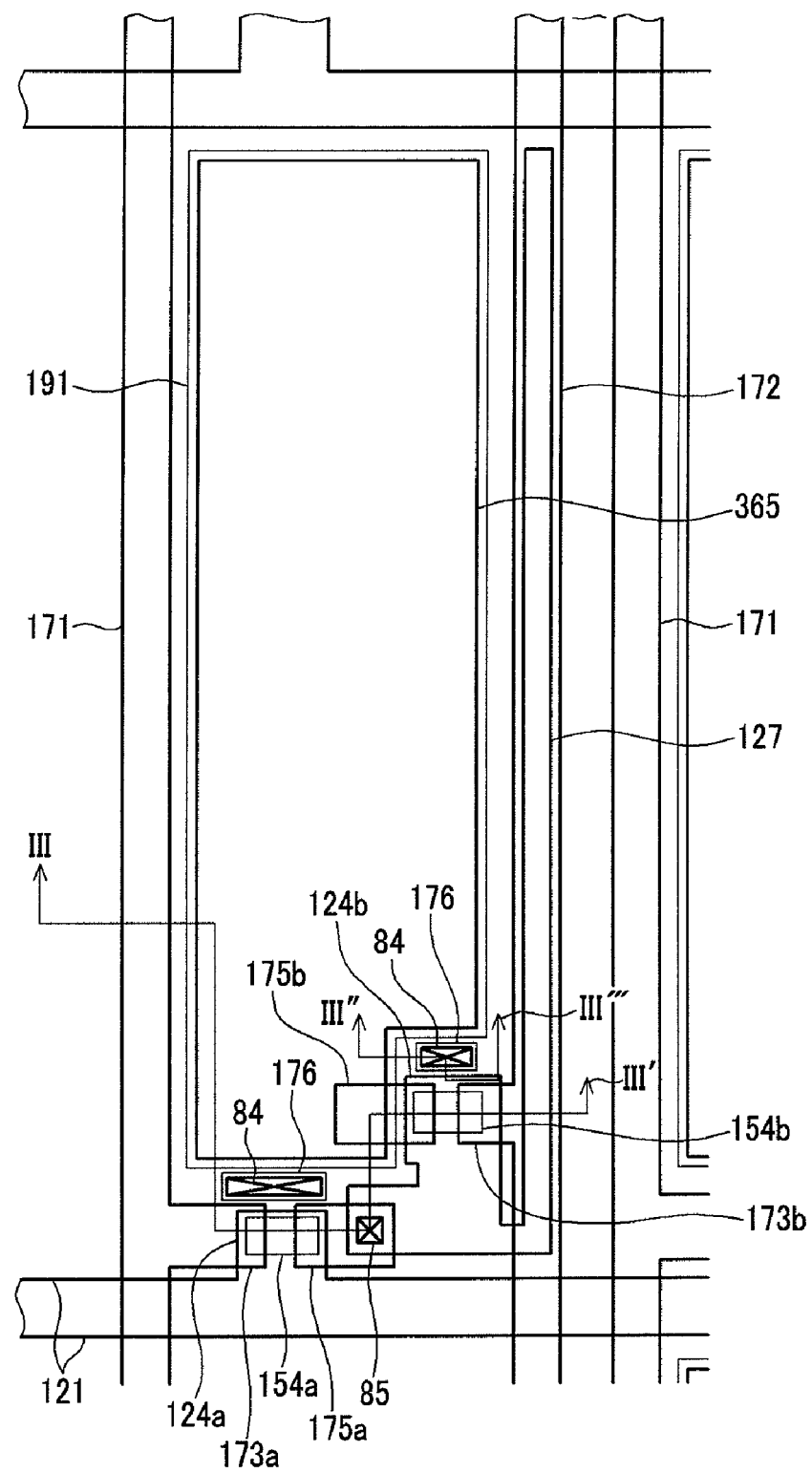
FIG. 2 is a layout view of an OLED display according to an exemplary embodiment of the present invention.
Figure 3:
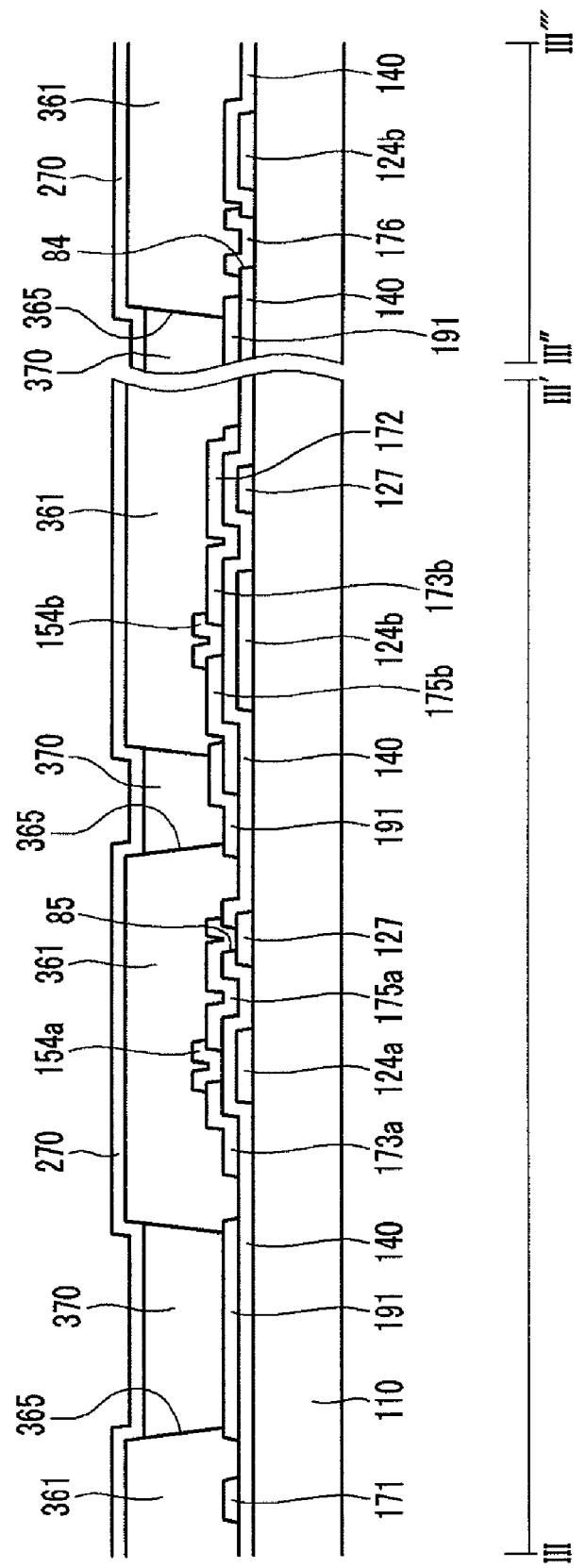
FIG. 3 is a sectional view of the OLED display shown in FIG. 2 taken along lines III-III' and lines III"-III"'.

FIG. 2 is a layout view of an OLED display according to an exemplary embodiment of the present invention, and FIG. 3 is a sectional view of the OLED display shown in FIG. 2 taken along lines III-III' and III"-III"'.

Referring to FIGS. 2 and 3, gate lines 121 including first control electrodes 124a and second control electrodes 124b are formed on an insulating substrate 110 made of transparent glass or plastic.

The gate lines 121 extend in a row direction and the first control electrode 124a protrudes upward in FIG. 2. The gate lines 121 may include a wide end part (not shown) for connecting to another layer or an external driving circuit.

The second control electrodes 124b are separated from the gate lines 121, and include storage electrodes 127 that extend longitudinally in a column direction.

A gate insulating film 140 made of silicon oxide or silicon nitride is formed on the gate lines 121 and the second control electrodes 124b. Openings 84 surrounding portions of the periphery of the first control electrodes 124a and the second control electrodes 124b are formed at positions spaced a predetermined distance from the first control electrodes 124a on the gate insulating film 140, and contact holes 85 exposing portions of the storage electrodes 127 are formed thereon.

Data lines 171, driving voltage lines 172, first output electrodes 175a and second output electrodes 175b, and blocking members 176 are formed on the gate insulating film 140.

The data lines 171 and the driving voltage lines 172 extend in a column direction and cross the gate lines 121. The data lines 171 include first input electrodes 173a extending toward the first control electrodes 124a, and the driving voltage lines 172 include second input electrodes 173b extending toward the second control electrodes 124b.

The first and second output electrodes 175a, 175b are separated from each other, and are also separated from the data lines 171 and the driving voltage lines 172. The first input electrodes 173a and the first output electrodes 175a face each other with the first control electrodes 124a interposed therebetween. The second input electrodes 173b and the second output electrodes 175b face each other with the second control electrodes 124b interposed therebetween.

The blocking member 176 is formed so as to surround portions of the peripheries of the first control electrodes 124a and the second control electrodes 124b at positions spaced a predetermined distance from the first control electrodes 124a and the second control electrodes 124b, and covers the openings 84 of the gate insulating film 140.

The data lines 171, the driving voltage lines 172, the first and second output electrodes 175a, 175b, and the blocking member 176 may be formed of the same layer, may be made of a transparent metal, and may function as a light blocking member since they contain a black pigment.

The storage electrodes 127 are connected to the first output electrodes 175a through the contact holes 85.

Pixel electrodes 191 and first and second semiconductor islands 154a, 154b are formed on the gate insulating film 140, the first and second input electrodes 173a, 173b, and the first and second output electrodes 175a, 175b.

The first semiconductor islands 154a are positioned on the first control electrodes 124a, and the second semiconductor islands 154b are positioned on the second control electrodes 124b.

The pixel electrodes 191 and the first and second semiconductor islands 154a, 154b may be made of a transparent oxide including zinc (Zn), magnesium (Mg), cadmium (Cd), tin (Sn), indium (In), gallium (Ga), hahnium (Ha), and the like, particularly, IGZO (indium gallium zinc oxide).

The pixel electrodes 191 and the first and second semiconductor islands 154a, 154b may be simultaneously formed.

Portions of the edges of the pixel electrodes 191 are formed directly on the second output electrodes 175b and are electrically connected thereto.

A plasma treatment may be performed on the surfaces of the pixel electrodes 191, and hydrogen atoms may be injected therein.

The first control electrode 124a, the first input electrode 173a, and the first output electrode 175a together with the first semiconductor 154a form the switching thin film transistor (switching TFT) Qs, and the second control electrode 124b, the second input electrode 173b, and the second output electrode 175b together with the second semiconductor 154b form the driving thin film transistor Qd.

The structures of the switching thin film transistor Qs, driving thin film transistor Qd, gate lines 121, data lines 171, and driving voltage lines 172 are only one example. Those skilled in the art will appreciate that various other examples are possible.

An insulation film 361 is formed on the data lines 171, driving voltage lines 172, output electrodes 175a, 175b, semiconductor islands 154a, 154b, and pixel electrodes 191. The insulation film 361 has banked openings 365 surrounding the edges of the pixel electrodes 191. The insulation film 361 may be made of an organic insulating material having thermal resistance and solvent resistance such as acrylic resin and polyimide resin, or an inorganic insulating material such as silicon dioxide ($SiO_2$) or titanium dioxide ($TiO_2$), and may have multiple layers. Also, the insulation film 361 may be made of an inorganic material such as silicon oxide or silicon nitride, or an organic material such as a polyacryl.

In the present exemplary embodiment, the insulation film 361 includes a black pigment, and thus defines a pixel area and serves as a light blocking member. Therefore, the insulation film 361 blocks the light entering the upper portions of the first and second semiconductors 154a, 154b, thereby preventing the first and second semiconductors 154a, 154b from being damaged.

As described above, the data lines 171, driving voltage lines 172, first and second output electrodes 175a, 175b, and blocking member 176 also include a black pigment and serve as a light blocking member such that the light entering the lower portions or lateral sides of the first and second semiconductors 154a, 154b is blocked, thereby preventing the first and second semiconductors 154a, 154b from being damaged. Particularly, in the OLED display according to the present exemplary embodiment, the width of the first and second semiconductor islands 154a, 154b is smaller than the width of the first and second input electrodes 173a, 173b and the first and second output electrodes 175a, 175b, and a blocking member 176 is formed under the other edges excluding the edges surrounded by the first and second input electrodes 173a, 173b, first and second output electrodes 175a, 175b, and first and second control electrodes 124a, 124b. Due to this, the lower portions of the edges of the first and second semiconductor islands 154a, 154b are surrounded by the first and second control electrodes 124a, 124b, first and second input electrodes 173a, 173b, first and second output electrodes 175a, 175b, and blocking member 176. Therefore, the light entering from the lower portions and lateral sides of the first and second semiconductor islands 154a, 154b is sufficiently blocked by the first and second input electrodes 173a, 173b, first and second output electrodes 175a, 175b, and blocking member 176.

Organic light emitting members 370 are formed in the banked openings 365. The organic light emitting members 370 may have a multilayered structure including an emitting layer (not shown) for emitting light and an auxiliary layer (not shown) for improving the light emitting efficiency of the emitting layer.

The emitting layer may be made of a high molecular material or a low molecular material that inherently emits any one of three primary colors (e.g., red, green, and blue), or a compound thereof.

The auxiliary layer may include one or more layers selected from the group consisting of an electron transport layer (not shown) and a hole transport layer (not shown) for adjusting the balance of electrons and holes, and an electron injecting layer (not shown) and a hole injecting layer (not shown) for enhancing the injection of electrons and holes.

The organic light emitting members 370 may implement a desired color for each pixel by arranging emitting layers emitting light of colors, such as red, green, and blue, in each pixel, or may implement a desired color by arranging emitting layers of three colors, such as red, green, and blue in one pixel with vertical or horizontal deposition to form a white emitting layer and forming color filters for implementing colors, such as red, green, and blue under or above the white emitting layer.

Furthermore, the luminance can be improved by further including the white pixel (W) as well as the red, green, and blue pixels (R, G, B) with stripe or checkered arrangements.

A common electrode 270 is formed on the organic light emitting members 370. The common electrode 270 is formed on the whole surface of the substrate, and may be made of an opaque conductor, such as gold (Au), platinum (Pt), nickel (Ni), copper (Cu), tungsten (W), or their alloys.

The common electrode 270 forms a pair with the pixel electrodes 191 to flow the current to the organic light emitting members 370.

As described above, the first control electrode 124a electrically connected to the gate lines 121 and the first input electrode 173a and first output electrode 175a electrically connected to the data lines 171 together with the first semiconductor island 154a constitute the switching thin film transistor (switching TFT) Qs, and a channel of the driving thin film transistor Qd is formed in the first semiconductor island 154a between the first input electrode 173a and the first output electrode 175a.

The second control electrode 124b electrically connected to the first output electrode 175a, together with the second input electrode 173b electrically connected to the driving voltage lines 172 and the second output electrode 175b and second semiconductor island 154b connected to the pixel electrodes 191, constitute the driving thin film transistor Qd, and a channel of the driving thin film transistor Qd is formed in the second semiconductor island 154b between the second input electrode 173b and the second output electrode 175b.

The pixel electrode 191, the organic light emitting member 370, and the common electrode 270 form an OLED LD. The pixel electrode 191 becomes an anode, and the common electrode 270 becomes a cathode. Alternatively, the pixel electrode 191 becomes a cathode and the common electrode 270 becomes an anode. Also, the storage electrode 127 and the driving voltage line 172, which are overlapped with one another, form a storage capacitor Cst.

The OLED display according to the present exemplary embodiment displays images by emitting light downward (in FIG. 3) of the substrate 110, and the light emitted upward of the substrate 110 from the organic light emitting members 370 is reflected by the common electrode 270 and directed downward again.

In an exemplary embodiment, the OLED display may alternatively display images by emitting light upward of the substrate.

While the OLED display according to the present exemplary embodiment has been described as having only one switching TFT and one driving TFT, the OLED display may further include at least one TFT and a plurality of lines for driving the TFT for compensating and preventing the OLED LD and the driving TFT Qd from being degraded even if the OLED display is driven for a long time, so as to prevent the lifetime of the OLED display from being shortened.

Now, a manufacturing method of the OLED display shown in FIGS. 2 and 3 according to an exemplary embodiment of the present invention will be described with reference to FIGS. 4 to 8 which are sectional views of intermediate steps of the manufacturing method.

Figure 4:
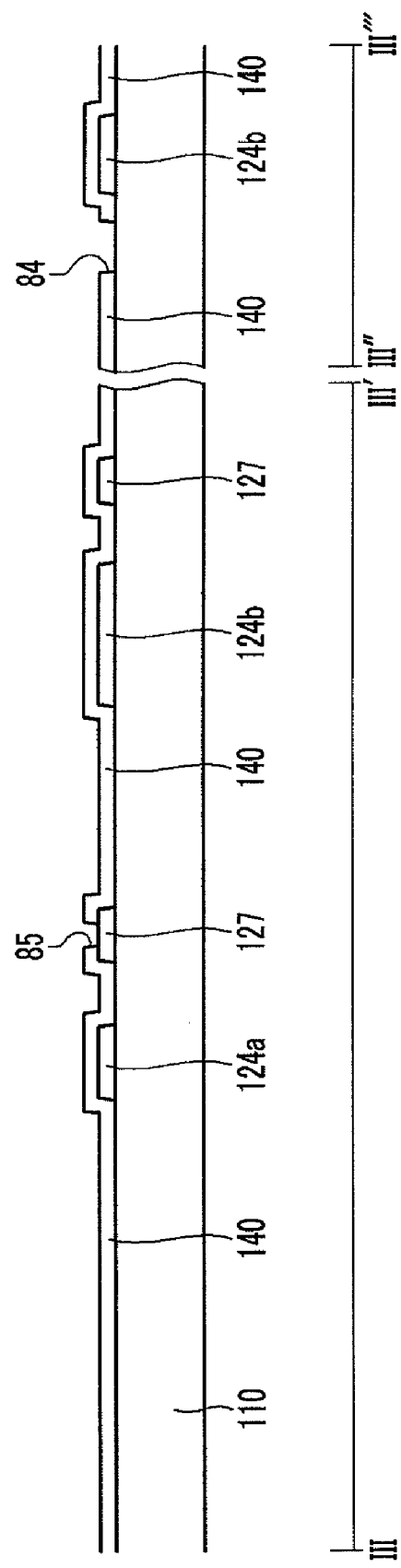
FIGS. 4, 5, 6, 7 and 8 are sectional views of intermediate steps of a manufacturing method of the OLED display shown in FIGS. 2 and 3.

Referring first to FIG. 4, gate lines 121 including first control electrodes 124a, second control electrodes 124b, and storage electrodes 127 are formed on a substrate 110, and a gate insulating film 140 having openings 84 exposing portions of the edges of the first and second control electrodes 124a, 124b and contact holes 85 exposing portions of the storage electrodes 127 are formed thereon.

Figure 5:
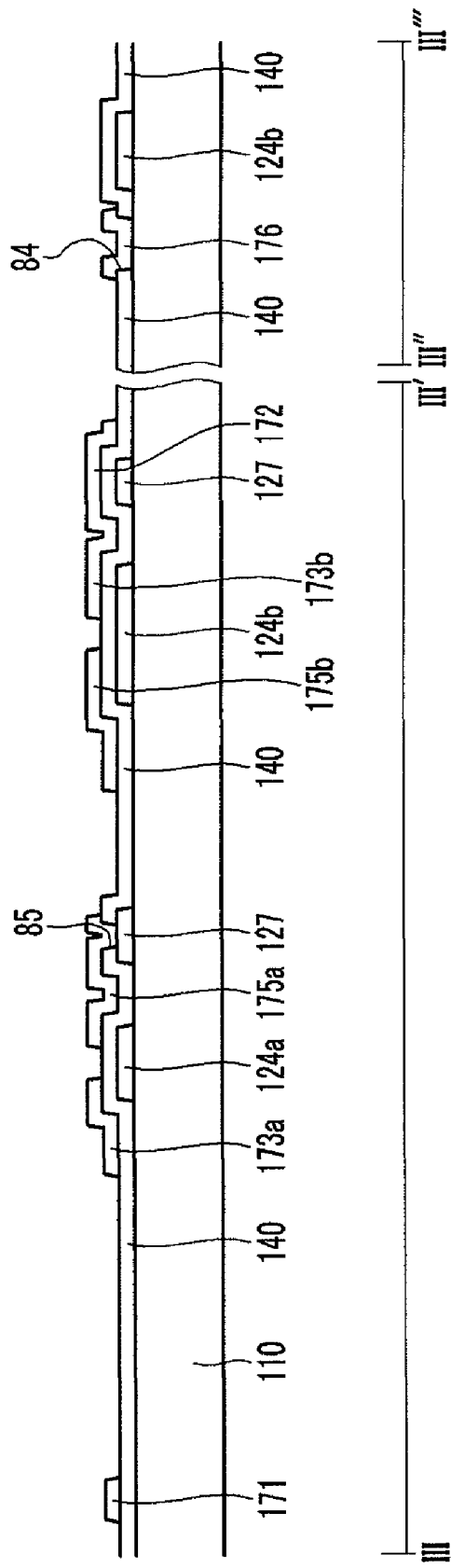

Referring to FIG. 5, data lines 171 including first input electrodes 173a, driving voltage lines 172 including second input electrodes 173b first and second output electrodes 175a, 175b, and a blocking member 176 are formed on the gate insulating film 140 and the exposed storage electrodes 127. At this time, an opaque metal layer is deposited by sputtering or the like, and is photo-etched. In the deposition of an opaque metal layer, a black pigment may be mixed and deposited together.

Figure 6:
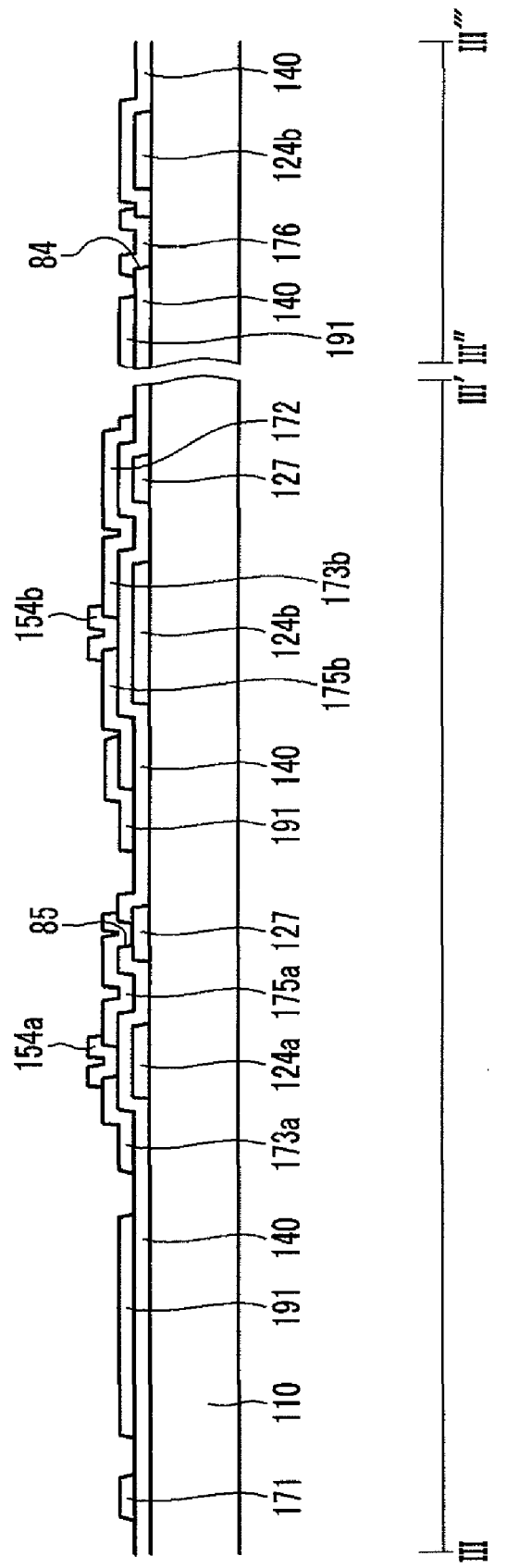

Referring to FIG. 6, a transparent oxide, for example IGZO (indium gallium zinc oxide), containing zinc (Zn), magnesium (Mg), cadmium (Cd), tin (Sn), indium (In), gallium (Ga), hahnium (Ha), and so forth, is deposited on the gate insulating film 140 and the first and second output electrodes 175a, 175b and then photo-etched to thus simultaneously form pixel electrodes 191 and first and second semiconductor islands 154a, 154b.

Figure 7:
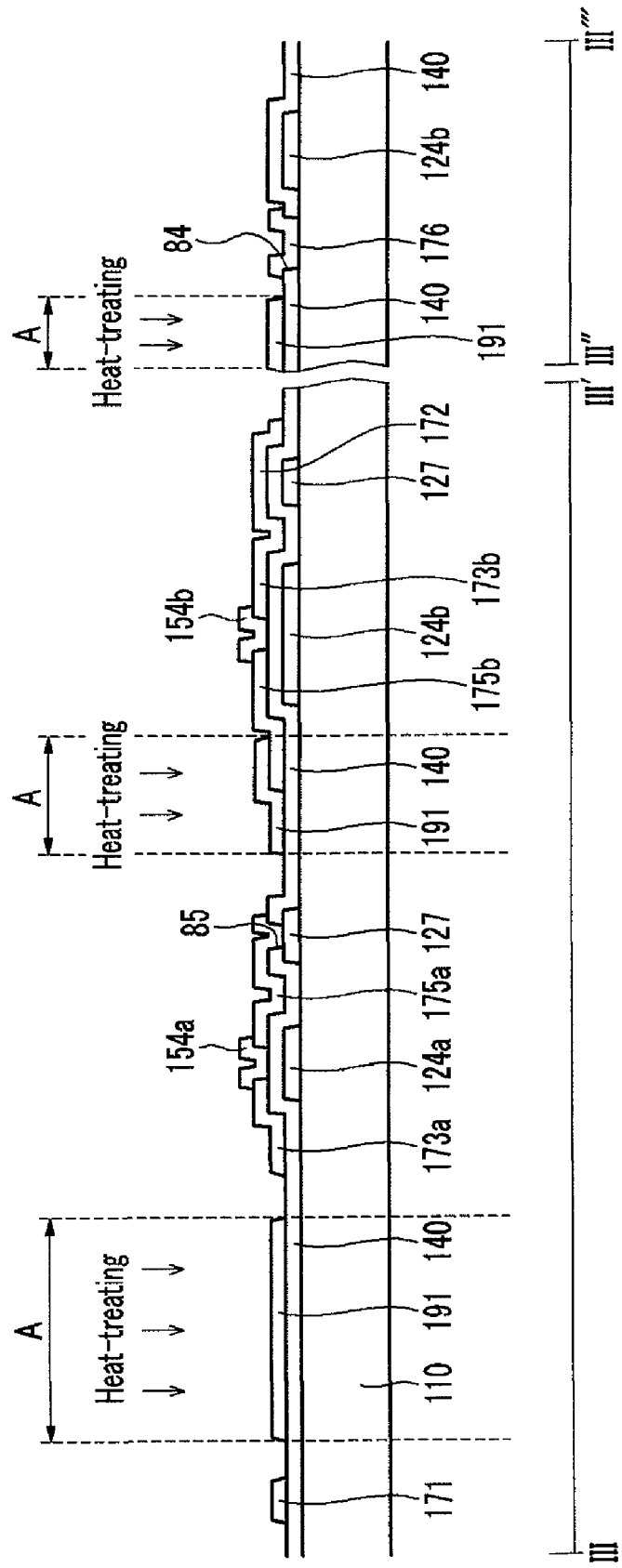

Referring to FIG. 7, portions A where the pixel electrodes 191 are formed are heat-treated under an atmosphere of oxygen ($O_2$) and nitrogen ($N_2$) or under an atmosphere of oxygen ($O_2$), nitrogen ($N_2$), and hydrogen ($H_2$). The other regions excluding the portions A where the pixel electrodes 191 are formed are covered with a mask, or a photosensitive film is formed on those regions, and then a heat treatment is performed. At least 50 sccm of an atmosphere gas of oxygen ($O_2$), nitrogen ($N_2$), and hydrogen ($H_2$) is injected, and the heat treatment temperature is about 100° C. or more, and particularly about 300° C. When the heat treatment is performed under these conditions, the conductivity of the pixel electrodes 191 increases.

Through the heat treatment, the conductivity of the pixel electrodes 191 made of an oxide semiconductor is increased, and thus can be used as an anode or cathode of the OLED.

Figure 8:
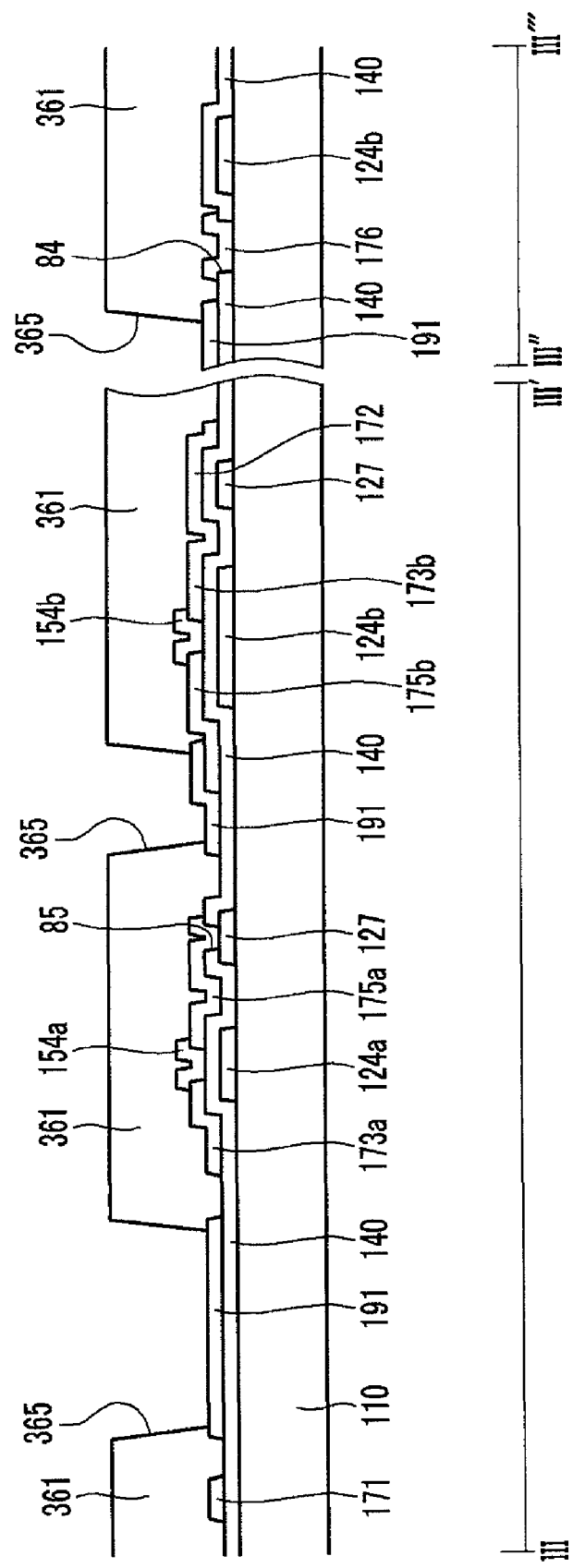

Next, referring to FIG. 8, a material layer such as an acrylic resin, a polyminide resin, silicon oxide, titanium oxide, etc., containing a black pigment is deposited on the data lines 171, driving voltage lines 172, output electrodes 175a, 175b, semiconductor islands 154a, 154b, and pixel electrodes 191, and then photo-etched to form an insulation film 361 having banked openings 365.

Although the insulation film 361 having banked openings 365 is formed after the heat treatment of the pixel electrodes 191 in the present exemplary embodiment, the insulation film 361 having banked openings 365 exposing the pixel electrodes 191 may be formed and then the heat treatment may be performed by using the insulation film 361 as a mask.

Finally, as shown in FIG. 3, organic light emitting members 370 are formed in the banked openings 365, and a common electrode 270 is formed thereon.

Next, the conductivity of the pixel electrodes 191 of the OLED display fabricated by the manufacturing method of an OLED display according to the present exemplary embodiment will be described with reference to FIG. 9 which is a graph showing the conductivity of the pixel electrodes 191 made of an oxide semiconductor. In the graph, the conductivity of the pixel electrodes 191 when heat treatment is not performed is denoted by Ref, and when heat treatment temperatures are about 100° C. 200° C., and 300° C., the conductivities of the pixel electrodes 191 are denoted by 100 deg, 200 deg, and 300 deg, respectively. About 50 sccm of oxygen ($O_2$) and nitrogen ($N_2$) is supplied as the atmosphere gas.

Figure 9:
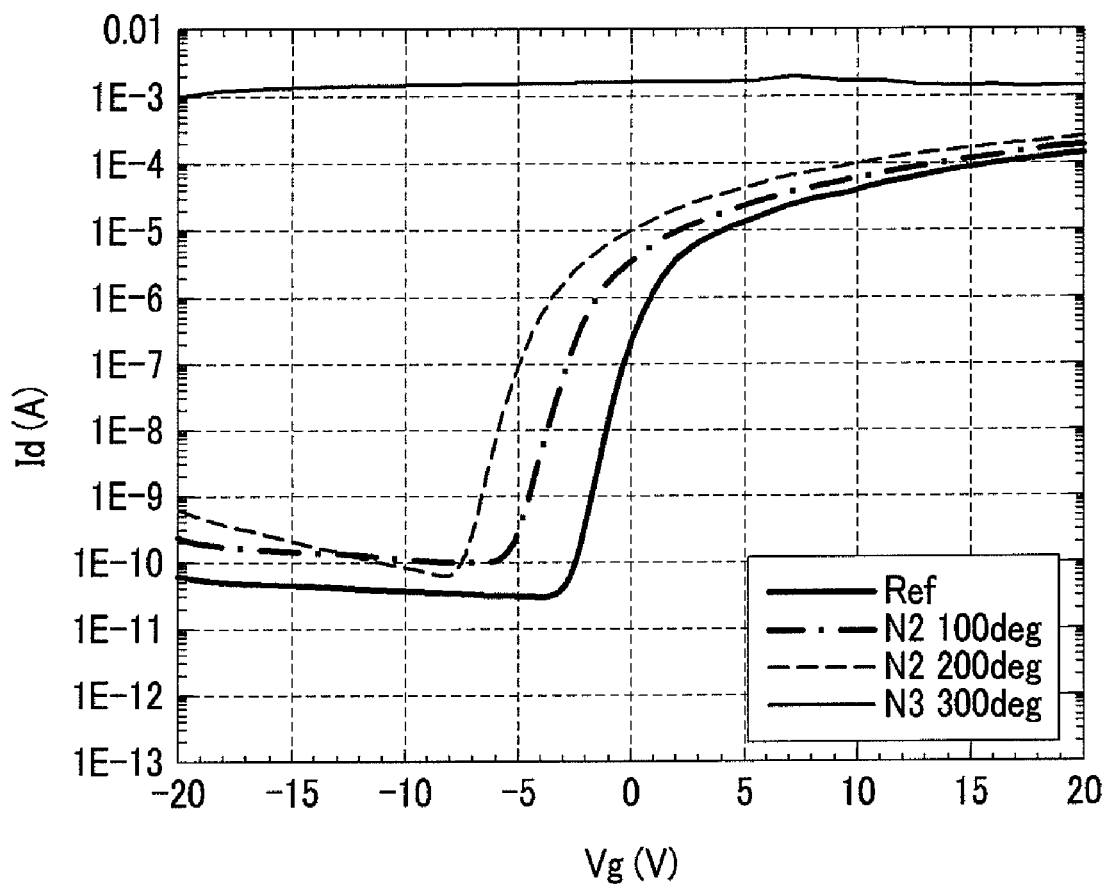
FIG. 9 is a graph showing the conductivity of pixel electrodes.

Referring to FIG. 9, in the case that the pixel electrodes 191 made of an oxide semiconductor are heat-treated under an atmosphere of oxygen ($O_2$) and nitrogen ($N_2$), it can be seen that the conductivities (100 deg, 200 deg, and 300 deg) of the pixel electrodes 191 when a heat treatment is performed are greater than that obtained when the heat treatment is not performed (Ref). Because the higher the heat treatment temperature the greater the conductivity, the conductivities are greatly increased when a heat treatment is performed at a temperature of about 300° C., and, as such, the pixel electrodes 191 can be sufficiently used as the anode or cathode of the OLED.

Next, another manufacturing method of the OLED display shown in FIGS. 2 and 3 according to an exemplary embodiment of the present invention will be described with reference to FIGS. 10 and 11 which are sectional views of intermediate steps of the manufacturing method.

The manufacturing method of an OLED display according to the present exemplary embodiment is substantially the same as the manufacturing method of an OLED display according to the previous exemplary embodiment.

First, as shown in FIGS. 4 to 6, gate lines 121 including first control electrodes 124*a*, second control electrodes 124*b*, and storage electrodes 127 are formed on a substrate 110, and a gate insulating film 140 is formed thereon. Thereafter, data lines 171 including first input electrodes 173*a*, driving voltage lines 172 including second input electrodes 173*b* and first and second output electrodes 175*a*, 175*b*, and a blocking member 176 are formed thereon, and a transparent oxide, for example IGZO (indium gallium zinc oxide), containing zinc (Zn), magnesium (Mg), cadmium (Cd), tin (Sn), indium (In), gallium (Ga), hahnium (Ha), and so forth, is deposited on the gate insulating film 140 and the first and second output electrodes 175*a*, 175*b* and then photo-etched to thus form pixel electrodes 191 and first and second semiconductor islands 154*a*, 154*b*.

Figure 10:
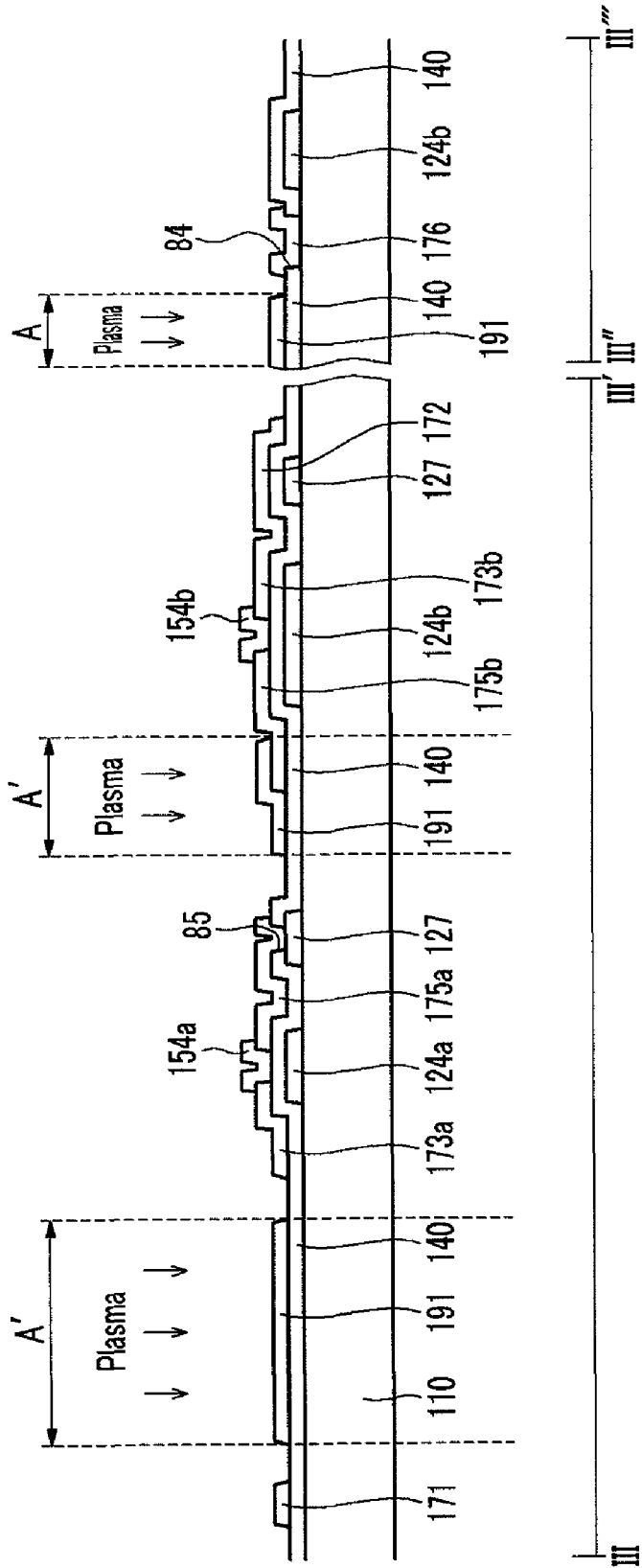
FIGS. 10 and 11 are sectional views of an intermediate step of a manufacturing method of the OLED display shown in FIGS. 2 and 3.

Next, as shown in FIG. 10, the portions A' where the pixel electrodes 191 are formed are plasma-treated. The other regions excluding the portions A where the pixel electrodes 191 are formed are covered with a mask, and then a plasma treatment is performed. Through the plasma treatment, hydrogen atoms may be introduced into the pixel electrodes 191.

Figure 11:
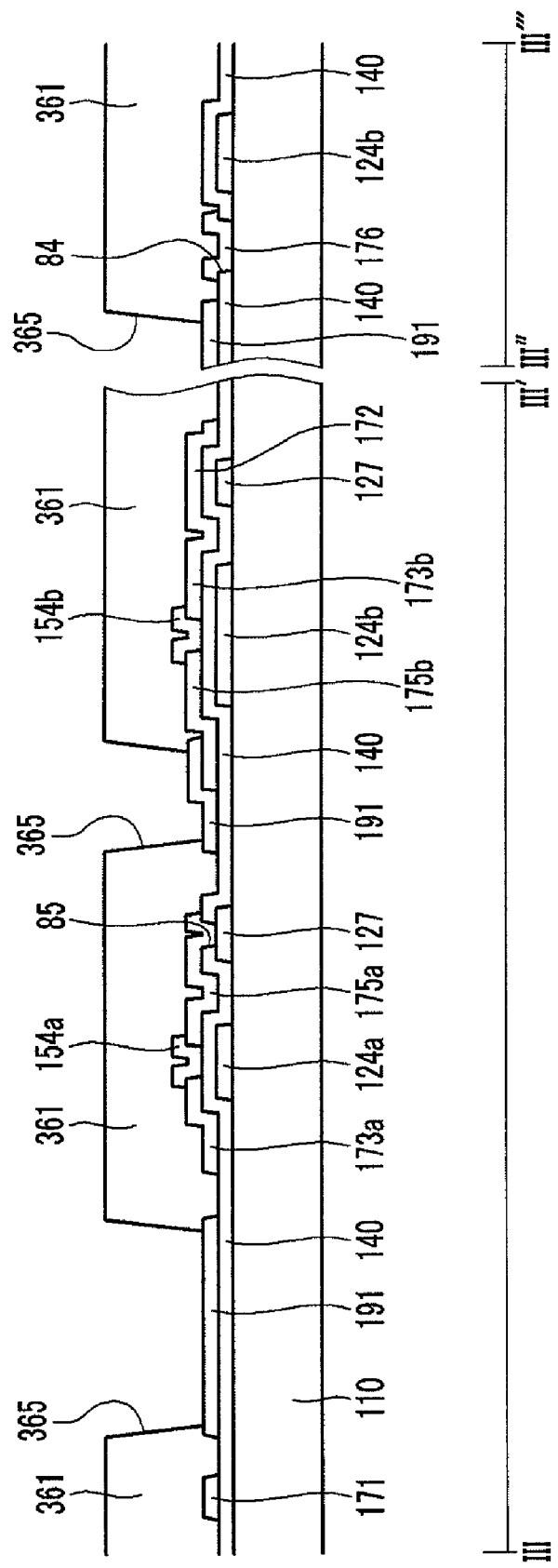

Next, referring to FIG. 11, a silicon oxide (SiOx) or silicon nitride (SiNx) layer containing a black pigment is deposited on the data lines 171, driving voltage lines 172, output electrodes 175*a*, 175*b*, semiconductor islands 154*a*, 154*b*, and pixel electrodes 191, and then photo-etched to thus form an insulation film 361 having banked openings 365. The silicon oxide (SiOx) or silicon nitride (SiNx) layer is dry-etched. During this dry-etching process, hydrogen atoms produced when depositing the silicon oxide (SiOx) or silicon nitride (SiNx) layer are injected into upper portions of the pixel electrodes 191. As shown in FIG. 10, hydrogen atoms can be easily introduced into upper portions of the pixel electrodes 191 by performing plasma treatment on the top surfaces of the pixel electrodes 191.

In this manner, by injecting hydrogen atoms into the upper portions of the pixel electrodes 191 made of an oxide semiconductor, the conductivity of the pixel electrodes 191 is increased, so that the pixel electrodes 191 can be used as the anode or cathode of the OLED.

Finally, as shown in FIG. 3, organic light emitting members 370 are formed in the banked openings 365, and a common electrode 270 is formed thereon.

As described above, in the OLED display and manufacturing method thereof according to the exemplary embodiments of the present invention, semiconductors 154*a*, 154*b* and pixel electrodes 191 are simultaneously formed by the use of an oxide semiconductor, thus simplifying the manufacturing process and raising the productivity, and the conductivity of the pixel electrodes 191 is increased by heat treatment, plasma treatment, and the like, thus enabling the pixel electrodes 191 to be used as the anode or cathode of the OLED.

Furthermore, by forming semiconductors 154*a*, 154*b* on the control electrodes, the input electrodes, and the output electrodes, damage to the semiconductor layer, which may occur in a thin film process, can be reduced.

Furthermore, by forming data lines 171, driving voltage lines 172, output electrodes 175*a*, 175*b*, and a blocking member 176 containing a black pigment below the semiconductors 154*a*, 154*b*, and forming an insulation film 361 containing a black pigment above the semiconductors 154*a*, 154*b*, light entering the oxide semiconductor can be blocked, thus preventing degradation in the characteristics of the oxide semiconductor caused by the light.

Figure 12:
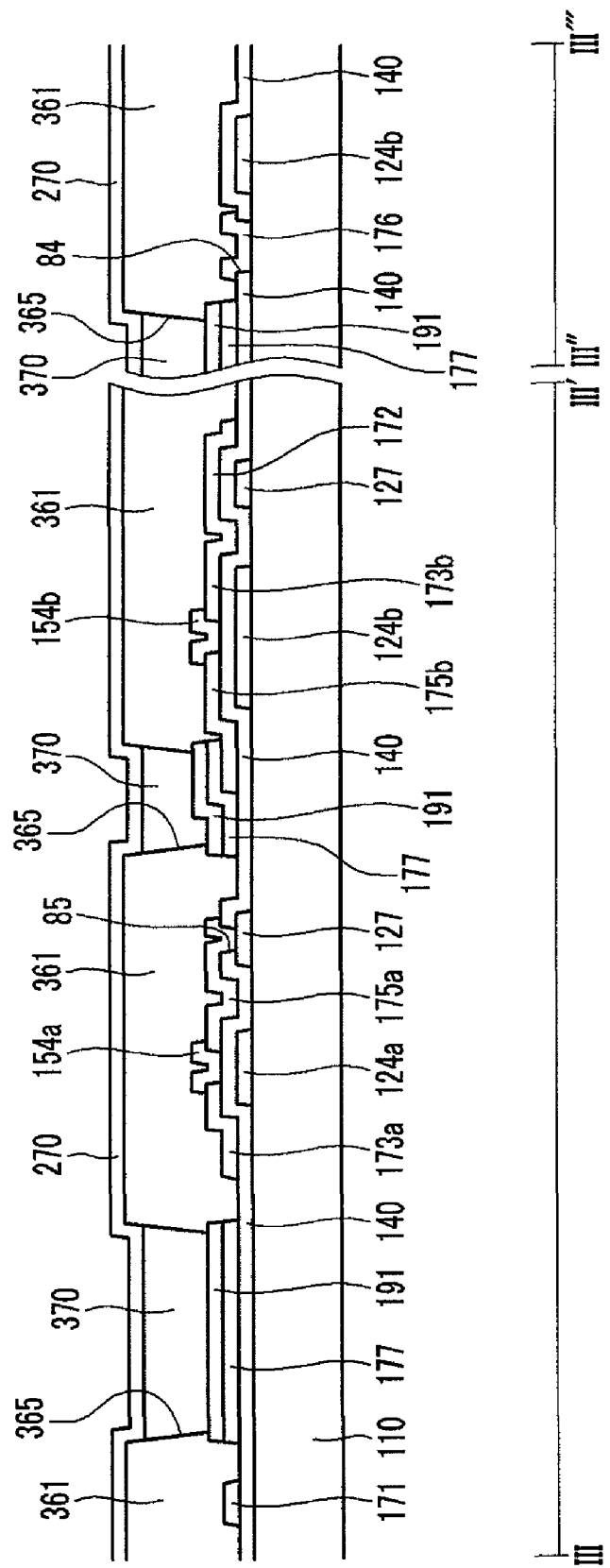
FIG. 12 is a sectional view of an OLED display according to an exemplary embodiment of the present invention.

Next, referring to FIG. 12, an OLED display according to an exemplary embodiment of the present invention will be described. The layer structure of the OLED display according to the present exemplary embodiment is substantially the same as that of the OLED display shown in FIGS. 2 and 3. However, unlike the OLED display shown in FIGS. 2 and 3, a reflection member 177 is formed below the pixel electrodes 191. The reflection member 177 may be formed as the same layer as the data lines 171, driving voltage lines 172, and output electrodes 175*a*, 175*b*. Further, the common electrode 270 of the OLED display according to the present exemplary embodiment may be formed of a transparent conductor, such as ITO or IZO.

Such an OLED display emits light upward of the substrate 110 to display images, and the light emitted from the organic light emitting members 370 toward the substrate 110 is reflected by the reflection member 177 and directed upward again.

All of the characteristics of the OLED display described with reference to FIGS. 2 and 3 may be applied to the OLED display shown in FIG. 12.

Those skilled in the art will appreciate that the exemplary embodiments of the present invention may be applicable to an OLED display having different structures.

While this invention has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims.

What is claimed is:

1. An organic light emitting diode display, comprising:
   a substrate;
   a control electrode disposed on the substrate;
   a gate insulating film covering the control electrode the gate insulating film having an opening that exposes the substrate;
   an input electrode and an output electrode disposed on the gate insulating film and facing each other;
   an oxide semiconductor disposed on the input electrode and the output electrode and disposed over the control electrode;
   a pixel electrode disposed on and electrically connected to portions of edges of the output electrode;
   an organic light emitting member disposed on the pixel electrode;
   a common electrode disposed on the organic light emitting member, and
   a blocking member covering the opening that exposes the substrate and configured such that light entering lower portions or lateral sides of the oxide semiconductor is blocked, wherein the pixel electrode comprises the same material as the oxide semiconductor.

2. The organic light emitting diode display of claim 1, wherein the pixel electrode comprises hydrogen injected into a portion of the pixel electrode.

3. The organic light emitting diode display of claim 2, further comprising an insulation film covering the oxide semiconductor and having an opening that exposes the pixel electrode, and wherein the organic light emitting member is disposed in the opening that exposes the pixel electrode.

4. The organic light emitting diode display of claim 3, wherein the insulation film comprises a black pigment.

5. The organic light emitting diode display of claim 3, wherein a surface of the pixel electrode is plasma treated.

6. The organic light emitting diode display of claim 1, wherein the blocking member comprises a black pigment.

7. The organic light emitting diode display of claim 1, wherein the blocking member is made of a same material as the input electrode and the output electrode.

8. The organic light emitting diode display of claim 1, wherein a width of the oxide semiconductor is smaller than a width of the input electrode and a width of the output electrode.

9. The organic light emitting diode display of claim 1, wherein the pixel electrode is formed directly on the portions of edges of the output electrode.

10. The organic light emitting diode display of claim 1, wherein:

the pixel electrode has a length that extends in a first direction and a length that extends in a second direction, the length that extends in the first direction being greater than the length that extends in the second direction; and a driving voltage line is connected to the input electrode, the driving voltage line being substantially parallel to the pixel electrode length that extends in the first direction.

* * * * *